(12) United States Patent
Denta et al.

(10) Patent No.: US 11,456,285 B2
(45) Date of Patent: Sep. 27, 2022

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Toshio Denta, Matsumoto (JP); Masanori Tanaka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/909,975

(22) Filed: Jun. 23, 2020

(65) Prior Publication Data

US 2021/0066258 A1 Mar. 4, 2021

(30) Foreign Application Priority Data

Aug. 28, 2019 (JP) .............................. JP2019-155928

(51) Int. Cl.
*H01L 25/07* (2006.01)
*H01L 25/18* (2006.01)
*H01L 23/00* (2006.01)
*H01L 23/31* (2006.01)
*H01L 21/56* (2006.01)
(Continued)

(52) U.S. Cl.
CPC ........ *H01L 25/072* (2013.01); *H01L 21/4871* (2013.01); *H01L 21/565* (2013.01); *H01L 23/3114* (2013.01); *H01L 23/367* (2013.01); *H01L 24/48* (2013.01); *H01L 25/18* (2013.01); *H01L 25/50* (2013.01); *H01L 2224/48137* (2013.01); *H01L 2224/48175* (2013.01)

(58) Field of Classification Search
None
See application file for complete search history.

(56) References Cited

U.S. PATENT DOCUMENTS

2001/0028107 A1* 10/2001 Wada .................... H01L 21/565
257/724
2008/0099922 A1* 5/2008 Sakamoto ............. H01L 21/565
257/758
(Continued)

FOREIGN PATENT DOCUMENTS

JP   H05-235234 A    9/1993
JP   2004-128420 A   4/2004
(Continued)

*Primary Examiner* — Michelle Mandala
*Assistant Examiner* — Jordan M Klein
(74) *Attorney, Agent, or Firm* — Rabin & Berdo, P.C.

(57) ABSTRACT

A semiconductor device, including a substrate having an insulating layer and a plurality of circuit patterns formed on the insulating layer, the substrate having a principal surface on which an element region is set. The semiconductor device further includes a plurality of semiconductor elements provided on the plurality of circuit patterns in the element region, a plurality of main terminals that each have a first end joined to one of the plurality of circuit patterns in the element region and a second end extending out of the substrate from a first side of the substrate, a plurality of control terminals disposed in a control region that is adjacent to a second side of the substrate opposite the first side, and a sealing member that seals the principal surface and the control region.

21 Claims, 8 Drawing Sheets

(51) Int. Cl.
*H01L 25/00* (2006.01)
*H01L 21/48* (2006.01)
*H01L 23/367* (2006.01)

(56) References Cited

U.S. PATENT DOCUMENTS

| | | | | |
|---|---|---|---|---|
| 2010/0133667 A1* | 6/2010 | Oka | ........................ | H01L 25/16 |
| | | | | 257/666 |
| 2014/0210060 A1* | 7/2014 | Nakamata | ............... | H01L 22/12 |
| | | | | 257/666 |
| 2014/0374889 A1* | 12/2014 | Denta | ............... | H01L 23/49517 |
| | | | | 257/666 |
| 2019/0006258 A1* | 1/2019 | Muto | .................... | H01L 21/481 |

FOREIGN PATENT DOCUMENTS

| JP | 2010-040615 A | 2/2010 |
|---|---|---|
| JP | 2014-146704 A | 8/2014 |

* cited by examiner

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority of the prior Japanese Patent Application No. 2019-155928, filed on Aug. 28, 2019, the entire contents of which are incorporated herein by reference.

BACKGROUND OF THE INVENTION

1. Field of the Invention

The embodiments discussed herein relate to a semiconductor device and a method of manufacturing a semiconductor device.

2. Background of the Related Art

In recent years, some semiconductor devices include semiconductor elements and a control integrated circuit that realizes driving control and the like of the semiconductor elements. As examples, the semiconductor elements referred to here may be IGBT (Insulated Gate Bipolar Transistors) and power MOSFETs (Metal Oxide Semiconductor Field Effect Transistors). This type of semiconductor device includes a substrate on which the semiconductor elements are mounted and a case that houses the substrate, and is sealed using sealing resin. Main terminals that are electrically connected to the main electrodes of the semiconductor elements and control terminals that are electrically connected to the control integrated circuit are insert molded into the case. The control integrated circuit is provided in the region of the case where the control terminals are disposed.

See, for example, Japanese Laid-open Patent Publication No. 2014-146704.

With the semiconductor device described above, a molding step of integrally molding the main terminals and control terminals on the case and a bonding step that bonds the substrate to this type of case are needed. A further step of electrically connecting circuit patterns provided on the semiconductor elements and the main terminals integrally molded to the case using bonding wires is also needed. In this way, when manufacturing a semiconductor device, many manufacturing steps and members are needed, which raises the manufacturing cost. There is also demand for improvements to the electrical and thermal characteristics.

SUMMARY OF THE INVENTION

According to an aspect, there is provided a semiconductor device including: a substrate including an insulating layer and a plurality of circuit patterns formed on the insulating layer, the substrate having a principal surface on which an element region is set; a plurality of semiconductor elements provided on the plurality of circuit patterns in the element region; a plurality of main terminals that each have a first end joined to one of the plurality of circuit patterns in the element region and a second end extending out of the substrate from a first side of the substrate; a plurality of control terminals disposed in a control region that is adjacent to a second side of the substrate opposite the first side; and a sealing member that seals the principal surface and the control region.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will now be described with reference to the drawings. Note that in the following description, the expressions "front surface" and "upper surface" refer to the surface of the semiconductor device 10 that faces upward in FIG. 2. In the same way, the expression "up" refers to the upward direction for the semiconductor device 10 in FIG. 2. The expressions "rear surface" and "lower surface" refer to the surface of the semiconductor device 10 that faces downward in FIG. 2. In the same way, the expression "down" refers to the downward direction for the semiconductor device 10 in FIG. 2. These expressions indicate the same directions as needed in the other drawings. The expressions "front surface", "upper surface", "up", "rear surface", "lower surface", "down", and "side surface" are merely convenient expressions used to specify relative positional relationships, and are not intended to limit the technical scope of the present embodiments. As one example, "up" and "down" do not necessarily mean directions that are perpendicular to the ground. That is, the "up" and "down" directions are not limited to the direction of gravity.

Figure 1A:
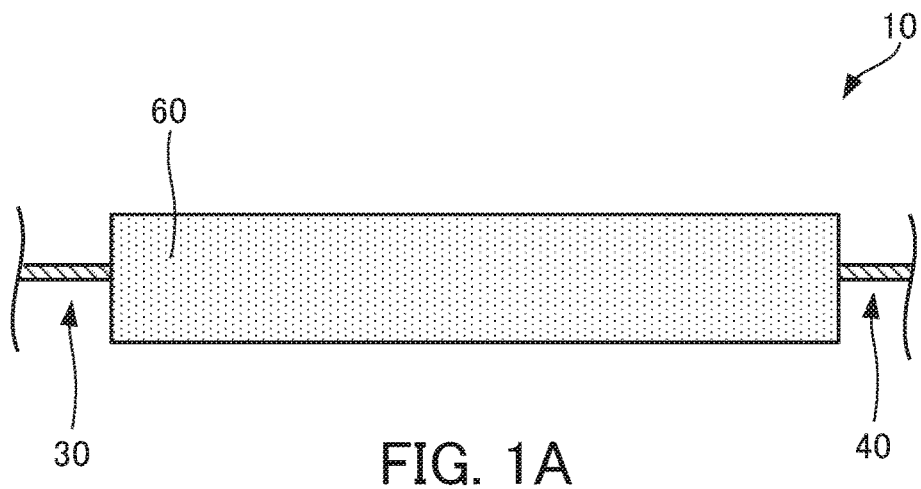
FIGS. 1A and 1B are views depicting an external appearance of a semiconductor device according to the present embodiments.
Figure 1B:
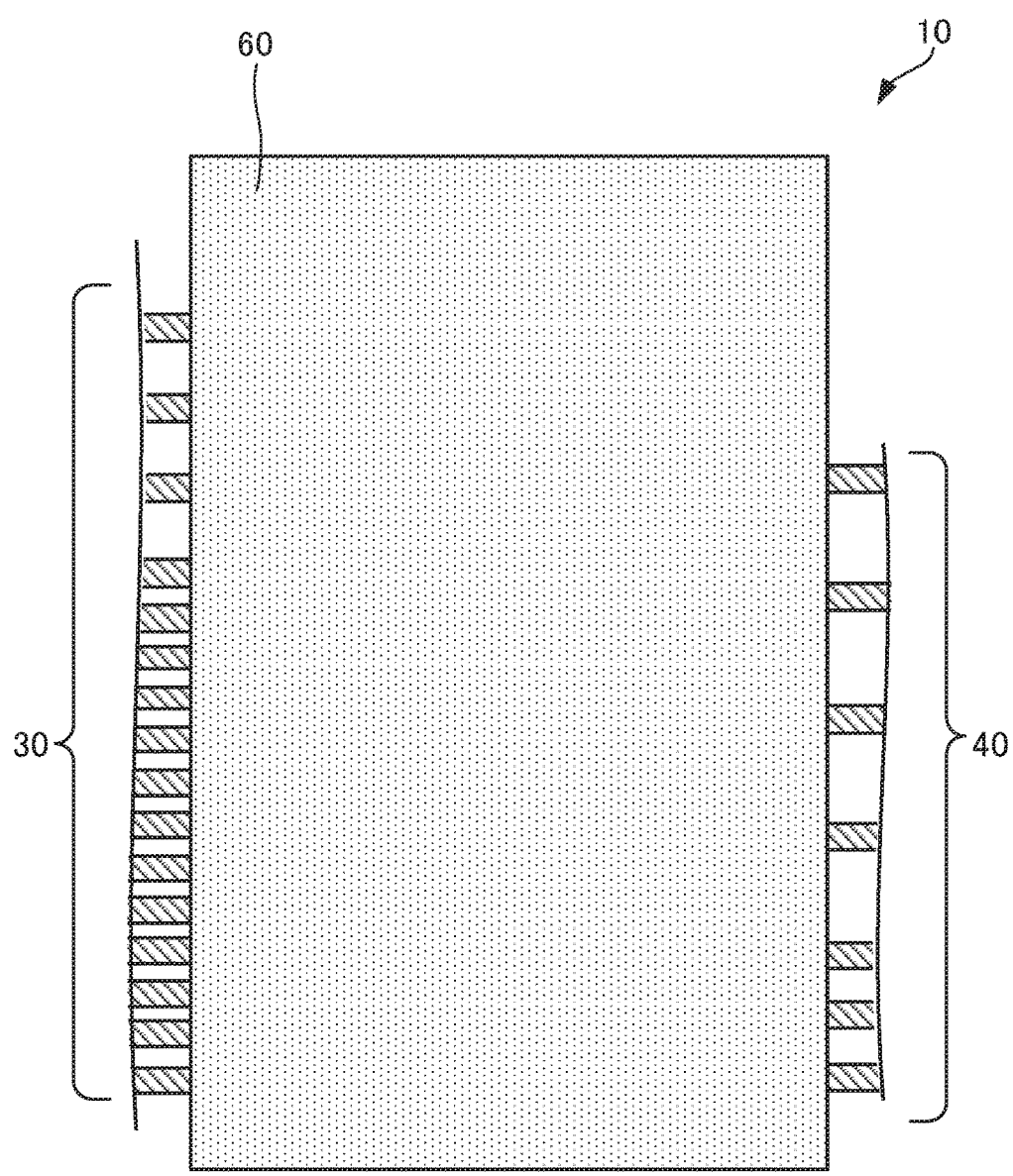
Figure 2:
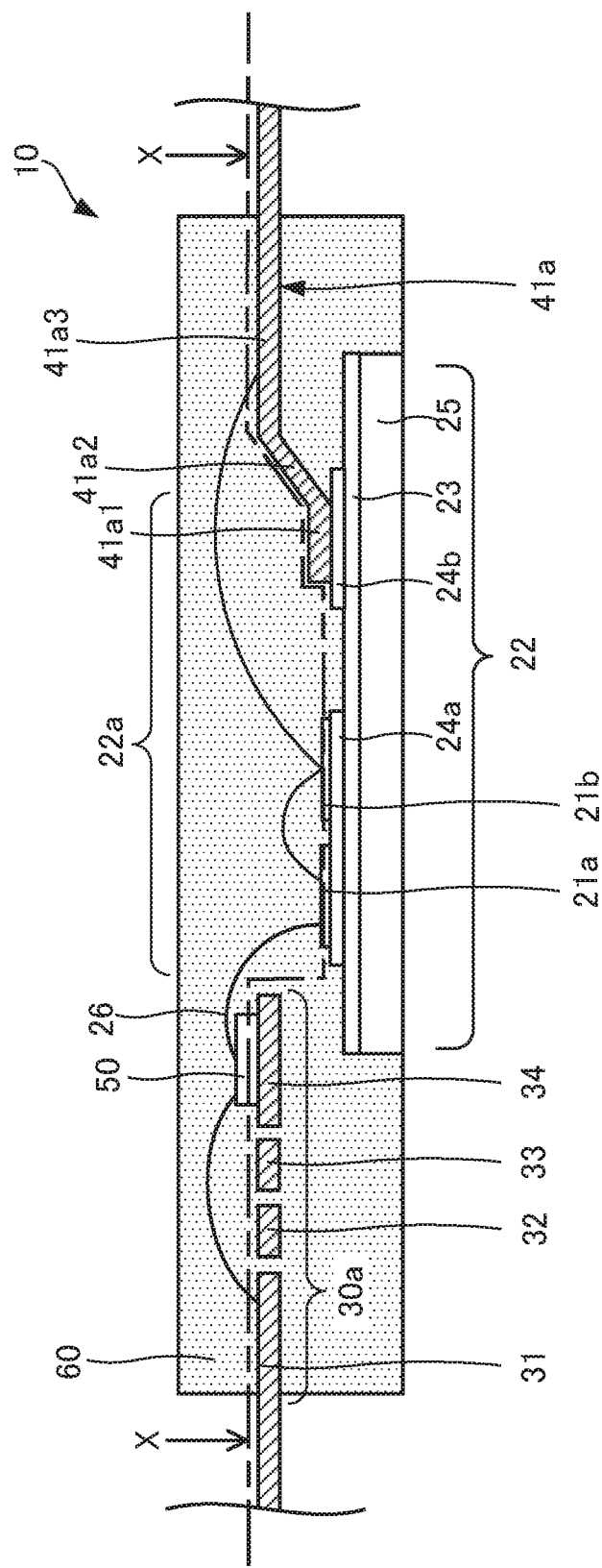
FIG. 2 is a side sectional view of the semiconductor device according to the present embodiments.
Figure 3:
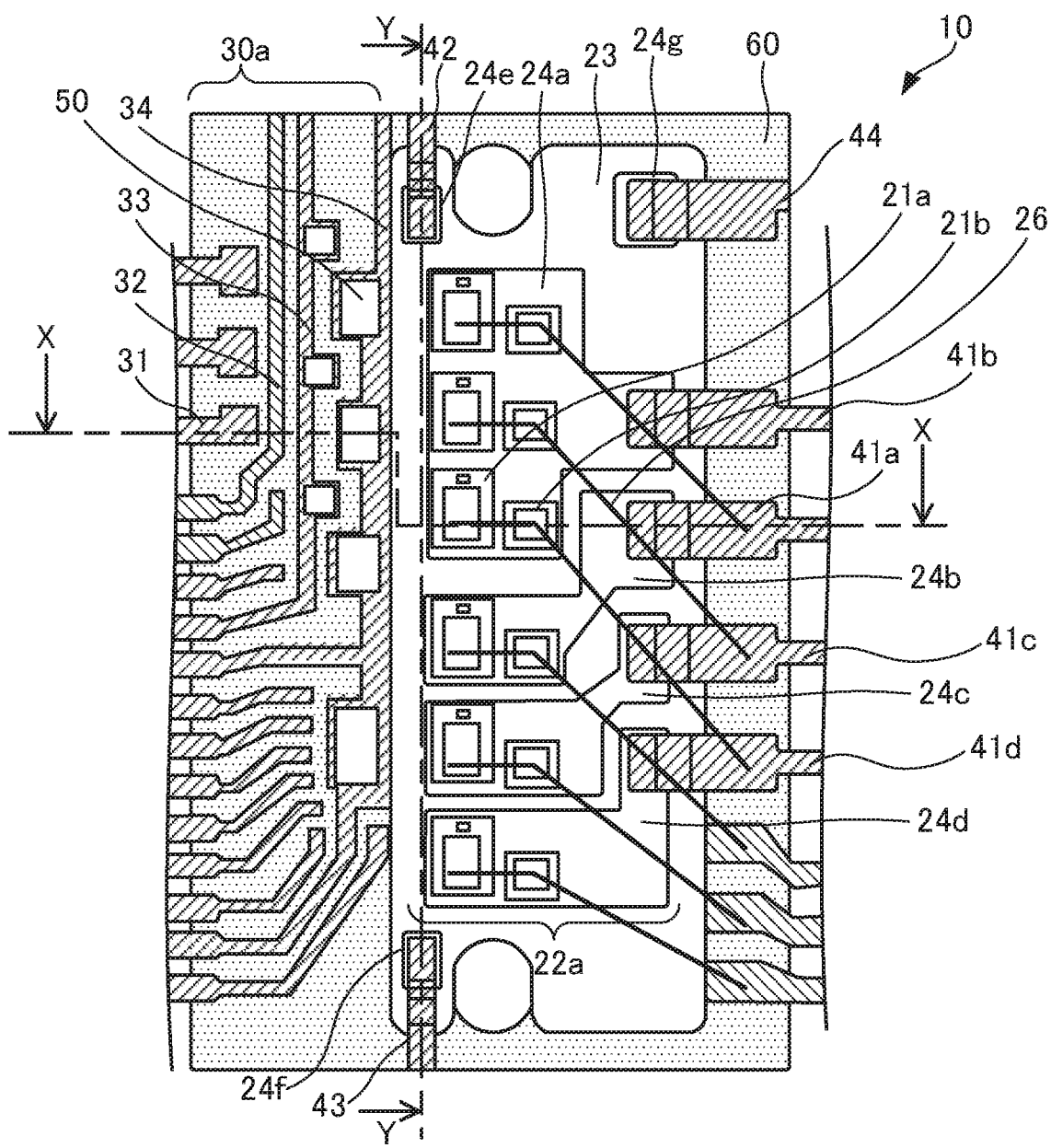
FIG. 3 is a plan sectional view of the semiconductor device according to the present embodiments.

A semiconductor device according to the present embodiments will now be described with reference to FIGS. 1A to 3. FIGS. 1A and 1B depict the external appearance of a semiconductor device according to the present embodiments. FIG. 1A is a side view of a semiconductor device 10 (as viewed from above or below in FIG. 1B), and FIG. 1B is a plan view of the semiconductor device 10. FIG. 2 is a side sectional view of the semiconductor device according to the present embodiments and FIG. 3 is a plan sectional view of the semiconductor device according to the present embodiments. FIG. 2 is a cross-sectional view taken along a dot-dash line X-X in FIG. 3, and FIG. 3 is a cross-sectional view taken along a dot-dash line X-X in FIG. 2. FIG. 3 corresponds to the plan view in FIG. 1B.

As depicted in FIGS. 1A and 1B, the entire structure of the semiconductor device 10 is sealed by a sealing member 60 to form a three-dimensional shape. Note that the sealing member 60 of the semiconductor device 10 may be cubic but have rounded corners. In the semiconductor device 10, a plurality of control terminals 30 and a plurality of main terminals 40 extend out from the respective side surfaces along the long edges of the sealing member 60. Note that in the present embodiments, when not distinguishing between individual terminals, the control terminals and the main terminals are collectively described as the "control terminals 30" and the "main terminals 40".

In this semiconductor device 10, a configuration like that depicted in FIGS. 2 and 3 is sealed by the sealing member 60. That is, the semiconductor device 10 includes six pairs of a first semiconductor element 21a and a second semiconductor element 21b, a metal base substrate 22, control terminals 30 (including control terminals 31 to 33), main terminals 40 (including main terminals 41a to 41d), and electronic components 50. In this semiconductor device 10, the control terminals 30, the electronic components 50, the first semiconductor elements 21a, the second semiconductor element 21b, and the main terminals 40 are electrically connected by appropriate bonding wires 26. Note that the bonding wires connected to the electronic components 50 have been omitted from FIG. 3. This configuration of the semiconductor device 10 is sealed by the sealing member 60. The bonding wires 26 are made of a metal, such as aluminum or copper, with superior electrical conductivity, or an alloy including at least one of these metals. The diameter of the bonding wires 26 is preferably at least 100 μm but not greater than 1 mm.

The first semiconductor elements 21a include switching elements, such as IGBT or power MOSFETs. When a first semiconductor element 21a is an IGBT, the collector electrode is provided on the rear surface as a main electrode, and a gate electrode and an emitter electrode as a main electrode are provided on the front surface. When a first semiconductor element 21a is a power MOSFET, a drain electrode as a main electrode is provided on the rear surface, and a gate electrode and a source electrode as a main electrode are provided on the front surface. The rear surface of each first semiconductor element 21a described above is joined by solder (not illustrated) to circuit patterns 24a, 24b, 24c, and 24d of the metal base substrate 22. As examples, the second semiconductor elements 21b include diodes such as SBD (Schottky Barrier Diodes) and FWD (FreeWheeling Diodes). These second semiconductor elements 21b each have an output electrode (cathode electrode) as a main electrode on the rear surface and an input electrode (anode electrode) as a main electrode on the front surface. The rear surface of each second semiconductor element 21b described above is joined by solder (not illustrated) to the circuit patterns 24a, 24b, 24c, and 24d. Note that in place of the first semiconductor elements 21a and the second semiconductor elements 21b, it is also possible to use an RC (Reverse-Conducting)-IGBT that combines the functions of an IGBT and an FWD. FIG. 3 merely depicts an example case where six pairs of the first semiconductor element 21a and the second semiconductor element 21b are provided. The number of pairs is not limited to six, and a number of pairs in keeping with the specification of the semiconductor device 10 or the like may be provided.

The metal base substrate 22 includes an insulating layer 23, the circuit patterns 24a, 24b, 24c, and 24d and fixing patterns 24e, 24f, and 24g formed on the insulating layer 23, and a heat dissipating plate 25 formed on the rear surface of the insulating layer 23. The insulating layer 23 is made of any of: epoxy resin; epoxy resin mixed with inorganic filler; polyimide; and polytetrafluoroethylene. Note that the thickness of the insulating layer 23 is preferably at least 0.09 mm but not greater than 0.15 mm. The circuit patterns 24a, 24b, 24c, and 24d and the fixing patterns 24e, 24f, and 24g are made of a metal with superior electrical conductivity, such as copper or a copper alloy. Note that the shapes of the circuit patterns 24a, 24b, 24c, and 24d and the fixing patterns 24e, 24f, and 24g in FIGS. 2 and 3 are mere examples. These circuit patterns 24a, 24b, 24c, and 24d and the fixing patterns 24e, 24f, and 24g are produced by etching a conductive plate or foil formed on one surface of the insulating layer 23, or by sticking a conductive plate to one surface of the insulating layer 23. Note that the thickness of the circuit patterns 24a, 24b, 24c, and 24d and the fixing patterns 24e, 24f, and 24g is preferably at least 0.10 mm but not greater than 1.00 mm, and more preferably at least 0.20 mm and not greater than 0.50 mm. The circuit patterns 24a, 24b, 24c, and 24d are formed in an element region 22a on the principal surface of the metal base substrate 22, as depicted in FIGS. 2 and 3. The first semiconductor elements 21a and the second semiconductor elements 21b are joined by solder (not illustrated) to the circuit patterns 24a, 24b, 24c, and 24d. The shapes, disposed positions, and numbers of the circuit patterns 24a, 24b, 24c, and 24d, and the disposed positions of the first semiconductor elements 21a and the second semiconductor elements 21b are mere examples, are not limited to FIGS. 2 and 3, and are set as appropriate according to the design, specification, and the like. Only hanger terminals 42, 43, and 44, described later, are fixed to the fixing patterns 24e, 24f, and 24g, which are not electrically connected to other components. Note that the shape and number of the fixing patterns 24e, 24f, and 24g are not limited to the examples depicted in FIGS. 2 and 3, and are set as appropriate according to the design, specification, and the like. However, it is preferable for the fixing patterns 24e, 24f, and 24g to be formed on one side (or "first side") of the metal base substrate 22 to which the main terminals 40, described later, are joined, or on another side (or "second side") which is opposite this first side. It is also preferable to form the fixing patterns 24e, 24f, and 24g at corners of the metal base substrate 22.

As examples, the heat dissipating plate 25 is made of aluminum, iron, silver, or copper, which have superior thermal conductivity, or an alloy including at least one of these metals. To improve corrosion resistance, as one example, a material such as nickel may also be formed on the surface of the heat dissipating plate by plating or the like. In more detail, aside from nickel, a nickel-phosphorus alloy, a nickel-boron alloy, or the like may be used. In addition, a radiator (not illustrated) may be attached to the rear side of the heat dissipating plate 25 via solder, silver solder, or the like to improve the dissipation of heat. As examples, the radiator used here is made of aluminum, iron, silver, or copper, which have superior thermal conductivity, or an alloy including at least one of these metals. A cooling device including a fin or a heat sink with a plurality of fins and a cooling device that uses water cooling or the like may also be used as the radiator. The heat dissipating plate may be integrally formed with this type of radiator. In that case, the heat dissipating plate is made of aluminum, iron, silver, or copper that have superior thermal conductivity, or an alloy including at least one of these materials. To improve corrosion resistance, as one example, a material such as nickel may be formed by plating or the like on the surface of the heat dissipating plate that is integrated with the cooler. In more detail, aside from nickel, a nickel-phosphorus alloy, a nickel-boron alloy, or the like may be used. Note that the thickness of the heat dissipating plate 25 is preferably at least 0.1 mm but not greater than 2.0 mm.

Each of the plurality of main terminals 40 has one end provided on the right side in FIG. 3 of the metal base substrate 22, and another end that extends out from a side surface (or "first side surface") on the right side of the semiconductor device 10 in FIG. 3. The main terminals 41b, 41a, 41c, and 41d out of the plurality of main terminals 40 are respectively joined to the circuit patterns 24a, 24b, 24c, and 24d of the metal base substrate 22. The main terminal 41a includes a joining portion 41a1, a linking portion 41a2, and a terminal portion 41a3. The joining portion 41a1 is parallel to the front surface of the metal base substrate 22 and is joined to the circuit pattern 24b. The linking portion 41a2 is inclined and integrally connects the joining portion 41a1 and the terminal portion 41a3. The terminal portion 41a3 is separated from the front surface of the metal base substrate 22 in keeping with the inclination of the linking portion 41a2, and extends from the metal base substrate 22 to the outside in parallel with the front surface. Note that although not illustrated, the main terminals 41b, 41c, and 41d have the same configuration as the main terminal 41a.

Figure 6:
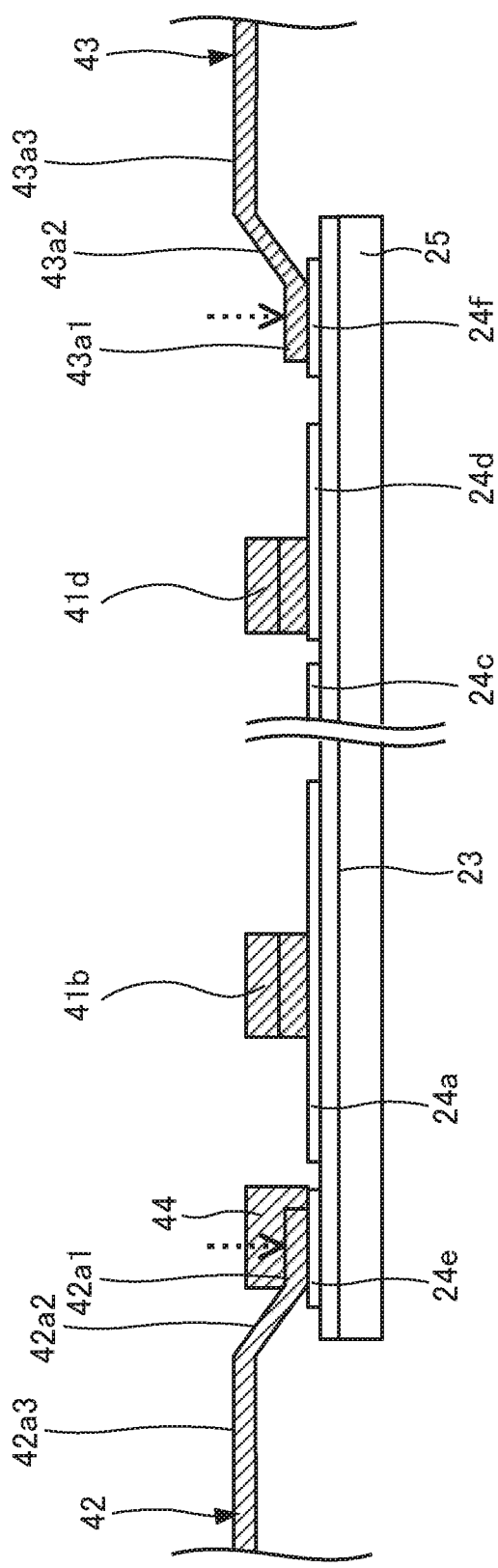
FIG. 6 is a diagram useful in explaining a step of joining hanger terminals, which is included in the method of manufacturing a semiconductor device according to the present embodiments.

The hanger terminals 42, 43, and 44 each have one end respectively joined to the fixing patterns 24e, 24f, and 24g described above, with the other end facing outward from the metal base substrate 22. The other end of the hanger terminal 42 is exposed from the side surface (or "third side surface") of the semiconductor device 10 at the top in FIG. 3, the other end of the hanger terminal 43 is exposed from the side surface (or "fourth side surface") of the semiconductor device 10 at the bottom in FIG. 3, and the other end of the hanger terminal 44 is exposed from the side surface (or "first side surface") of the semiconductor device 10 on the right in FIG. 3. As described later, the parts of the hanger terminals 42, 43, and 44 that extend from the semiconductor device 10 are removed, so that the other ends of the hanger terminals 42, 43, and 44 do not protrude from the side surfaces of the semiconductor device 10. As depicted in FIG. 6 described later, the hanger terminals 42 and 43 include joining portions 42a1 and 43a1, linking portions 42a2 and 43a2, and hanger portions 42a3 and 43a3. Although not illustrated, the hanger terminal 44 has the same configuration as the hanger terminals 42 and 43.

The plurality of control terminals 30 (including the control terminals 31, 32, and 33) are provided in a control region 30a that is adjacent to the other side of the metal base substrate 22 that is opposite the first side of the metal base substrate 22 to which the plurality of main terminals 40 are joined. The control region 30a is located at a higher position than the front surface of the metal base substrate 22. The control terminals 30 extend outward from the side surface (or "second side surface") of the semiconductor device 10 on the left in FIG. 3. The plurality of control terminals 30 further include a control wiring portion 34. The control wiring portion 34 is disposed in the control region 30a, with the electronic components 50 being mounted via solder (not illustrated). The control wiring portion 34 is positioned at the same height as the parts of the control terminals 30 that extend to the outside from the side surface. The control wiring portion 34 is positioned higher than the parts of the main terminals 40 that are joined to the circuit patterns 24a, 24b, 24c, and 24d and the parts of the hanger terminals 42, 43, and 44 that are joined to the fixing patterns 24e, 24f, and 24g. The control terminals 30, the terminal portion 41a3 of the main terminals 41a, 41b, 41c and 41d (the terminal portions of the main terminals 41b, 41c and 41d are not depicted), and the hanger portions 42a3 and 43a3 of the hanger terminals 42, 43 and 44 (the hanger portion of the hanger terminal 44 is not depicted) are positioned at the same height.

The plurality of main terminals 40, the hanger terminals 42, 43, and 44, and the control terminals 30 (including the control terminals 31, 32, and 33) are made of a metal that has superior electrical conductivity, such as copper or a copper alloy. In addition, these terminals may be coated with a metal, such as nickel or nickel alloy.

A suitable number of electronic components 50 are joined to the control wiring portion 34 via solder (not illustrated). As the electronic components 50, control ICs, thermistors, capacitors, resistors, and the like are used as appropriate to provide the semiconductor device 10 with the desired functions. The sealing member 60 seals the configuration described above. This sealing member 60 includes a thermosetting resin, such as maleimide-modified epoxy resin, maleimide-modified phenol resin, or maleimide resin, and a filler contained in the thermosetting resin. A specific example is epoxy resin, which includes a filler such as silicon oxide, aluminum oxide, boron nitride, or aluminum nitride.

Figure 4:
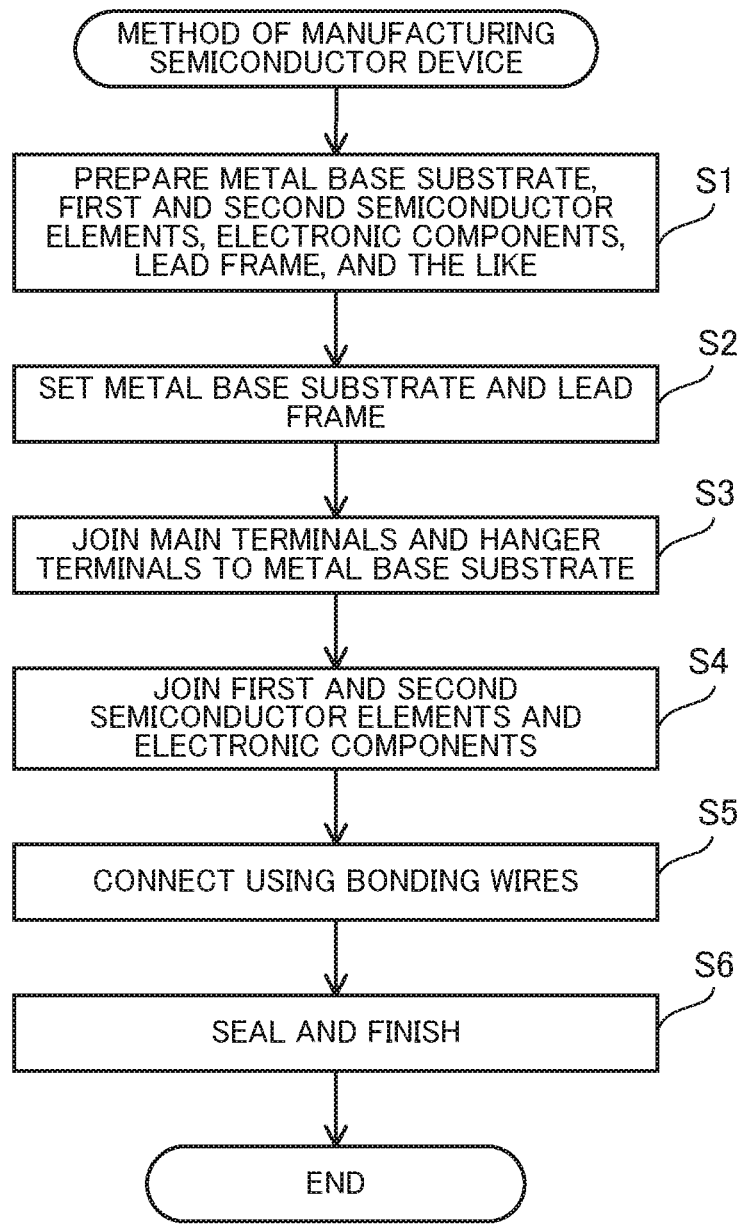
FIG. 4 is a flowchart depicting a method of manufacturing a semiconductor device according to the present embodiments.
Figure 5:
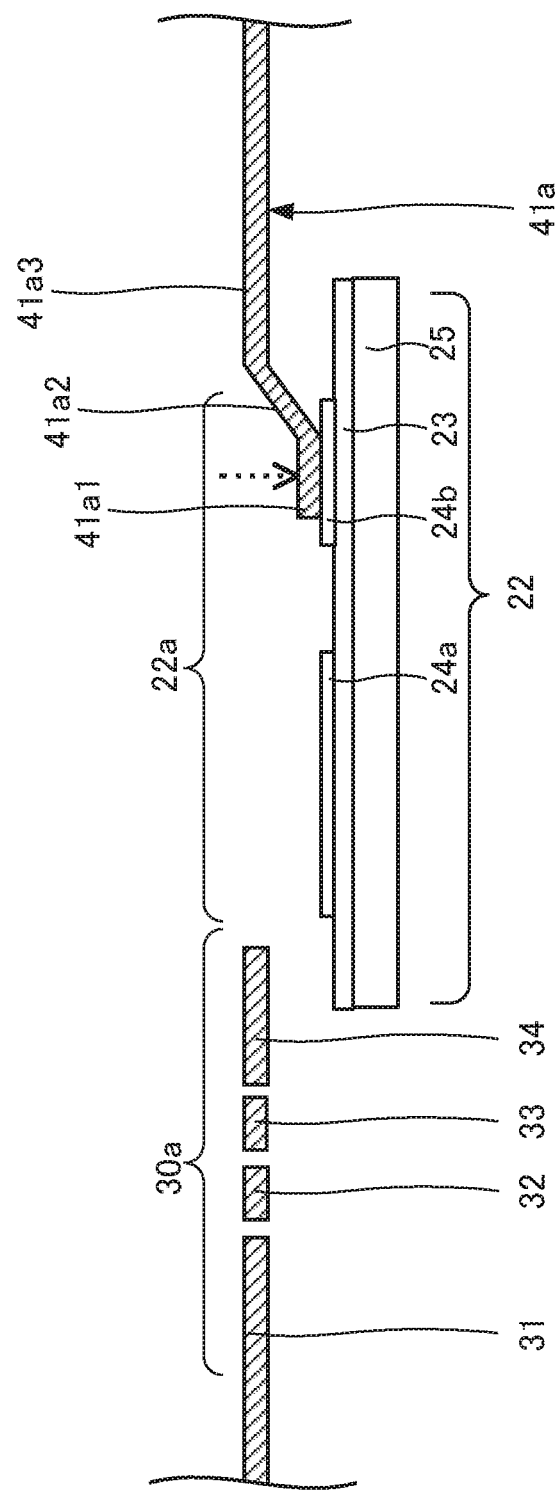
FIG. 5 is a diagram useful in explaining a step of joining external connection terminals, which is included in the method of manufacturing a semiconductor device according to the present embodiments.
Figure 7:
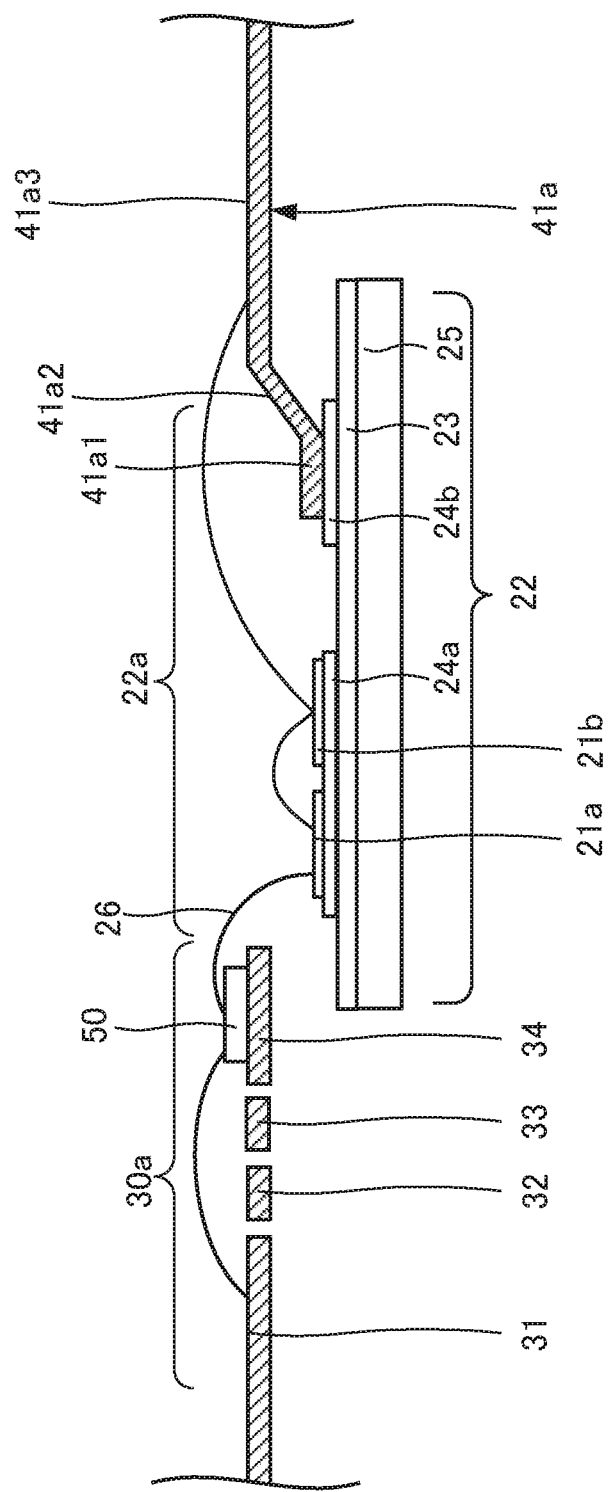
FIG. 7 is a diagram useful in explaining a step of joining semiconductor elements and electronic components and a step of connecting with bonding wires in the method of manufacturing a semiconductor device according to the present embodiments.
Figure 8:
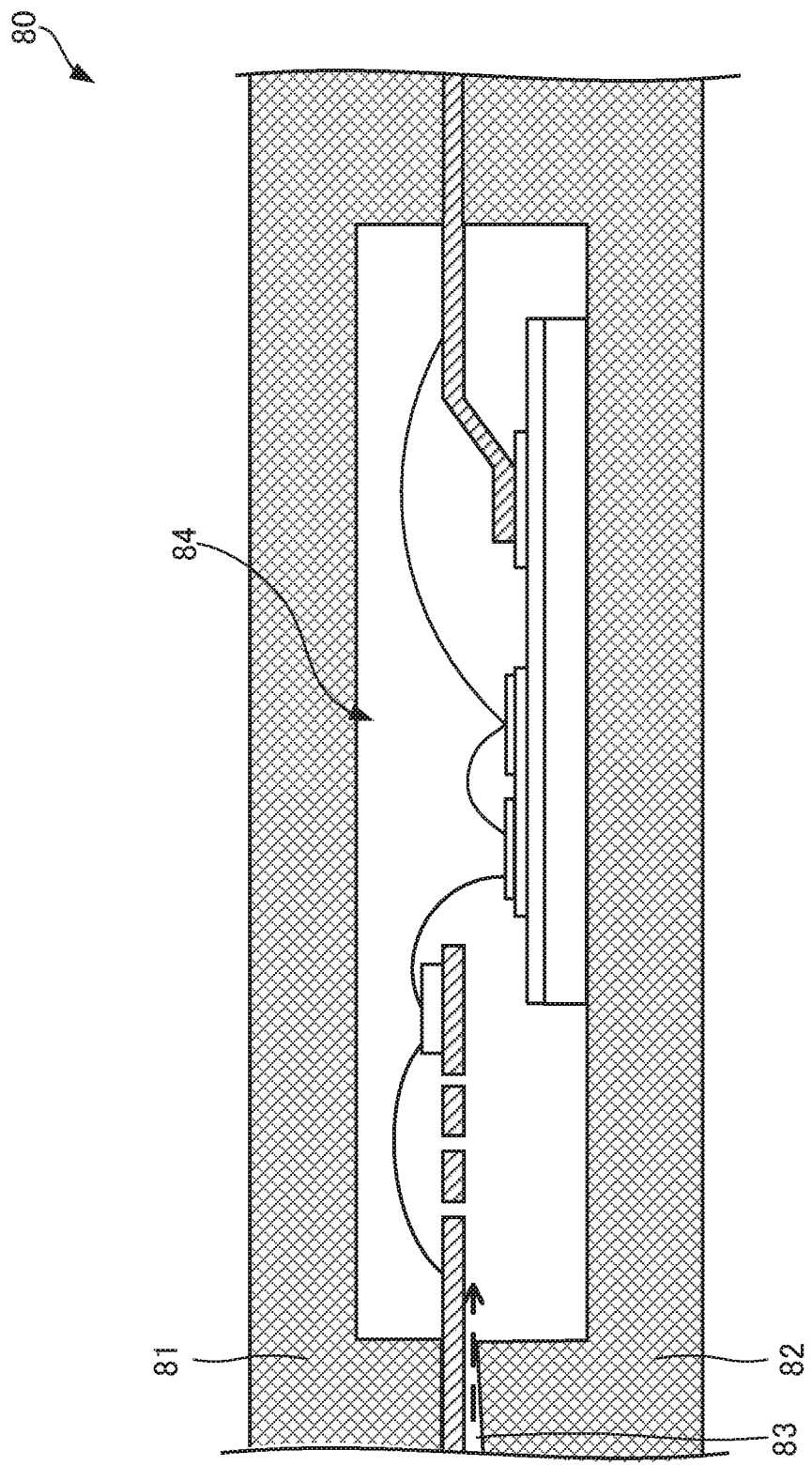
FIG. 8 is a diagram useful in explaining a step of sealing in the method of manufacturing a semiconductor device according to the present embodiments.

Next, a method of manufacturing a semiconductor device 10 like that described above will be described with reference to FIGS. 4 to 8. FIG. 4 is a flowchart depicting a method of manufacturing a semiconductor device according to the present embodiments. FIG. 5 is a diagram useful in explaining a step of joining external connection terminals, which is included in the method of manufacturing a semiconductor device according to the present embodiments. FIG. 6 is a diagram useful in explaining a step of joining hanger terminals, which is included in the method of manufacturing a semiconductor device according to the present embodiments. Note that FIGS. 5 and 6 are cross-sectional views corresponding to positions of a dot-dash line X-X and a dot-dash line Y-Y in FIG. 3. FIG. 7 is a diagram useful in explaining a step of joining semiconductor elements and electronic components and a step of connecting with bonding wires in the method of manufacturing a semiconductor device according to the present embodiments, and FIG. 8 is a diagram useful in explaining a step of sealing in the method of manufacturing a semiconductor device according to the present embodiments. Note that FIGS. 7 and 8 are cross-sectional views corresponding to the position of the dot-dash line X-X in FIG. 3.

First, the components of the semiconductor device 10, such as the first semiconductor elements 21a, the second semiconductor elements 21b, the metal base substrate 22, a lead frame (not illustrated) where the plurality of control terminals 30, the plurality of main terminals 40, and the hanger terminals 42, 43, and 44 are aligned by tie bars, the electronic components 50, and the raw materials of the sealing member 60 are prepared (Step S1). Next, the lead frame described above is set on the metal base substrate 22 (Step S2). At this time, as one example, as depicted in FIG. 5, the control wiring portion 34 of the control terminals 30 (the control terminals 31, 32, and 33 are depicted in FIG. 5)

included in the lead frame is positioned in the control region 30a. At the same time, the joining portion 41a1 of the main terminal 41a (the main terminals 41b, 41c, and 41d are the same) included in the lead frame (the joining portions of the main terminals 41b, 41c, and 41d are omitted from the drawing) is positioned on the circuit pattern 24b (or the circuit patterns 24a, 24c, and 24d for the other terminals) of the metal base substrate 22. At this time, a predetermined jig or the like (not illustrated) is used so that the control terminals 30 and the control wiring portion 34 are kept in the control region 30a that is at a higher position than the principal surface of the metal base substrate 22.

Next, as depicted in FIG. 5, the joining portion 41a1 of the main terminal 41a included in the lead frame set on the circuit pattern 24b of the metal base substrate 22 is joined by ultrasonic bonding (in the direction of the dashed arrow) to the circuit pattern 24b. In the same way, the main terminals 41b, 41c, 41d included in the lead frame set on the circuit patterns 24a, 24c, and 24d of the metal base substrate 22 are joined in the same way by ultrasonic bonding. At the same time, as depicted in FIG. 6, the joining portions 42a1 and 43a1 of the hanger terminals 42 and 43 included in the lead frame set on the fixing patterns 24e and 24f of the metal base substrate 22 are joined (in the direction of the dashed arrow) by ultrasonic bonding. In the same way, the hanger terminal 44 included in the lead frame set on the fixing pattern 24g of the metal base substrate 22 is similarly joined by ultrasonic bonding (Step S3). By doing so, three out of the four edges of the metal base substrate 22 become suspended by the main terminals 41a, 41b, 41c, and 41d and the hanger terminals 42, 43, and 44. As a result, the metal base substrate 22 is kept horizontal in the following manufacturing steps. Also, as described earlier, on the metal base substrate 22, the thickness of the circuit patterns 24a, 24b, 24c, and 24d and the fixing patterns 24e, 24f, and 24g is preferably at least 0.10 mm but not greater than 1.00 mm, and more preferably, at least 0.20 mm but not greater than 0.50 mm. This value is at least 10 times or so thicker than the thickness of the insulating layer 23. This means that even if ultrasonic bonding is performed on the circuit patterns 24a, 24b, 24c, and 24d and the fixing patterns 24e, 24f, and 24g on the insulating layer 23, it is possible to reliably transmit the ultrasonic vibration, so that the main terminals 40 and the control terminals 30 may be stably joined.

Next, as depicted in FIG. 7, a first semiconductor element 21a and a second semiconductor element 21b are both joined to the circuit pattern 24b via solder. In the same way, other first semiconductor elements 21a and second semiconductor elements 21b are joined to the circuit patterns 24a, 24c, and 24d via solder. The electronic components 50 are also joined to the control wiring portion 34 via solder (Step S4). Next, as depicted in FIG. 7, the control terminals 30, the electronic components 50, the first semiconductor elements 21a, the second semiconductor elements 21b, and the main terminals 40 (in FIG. 7, the main terminal 41a) are electrically connected as appropriate by the bonding wires 26 (Step S5).

Next, the assembly depicted in FIG. 7 is placed between an upper die 81 and a lower die 82 of a molding die 80. By doing so, as depicted in FIG. 8, the metal base substrate 22, and the plurality of control terminals 30, the plurality of main terminals 40, and the hanger terminals 42, 43, and 44 of the lead frame become housed in a cavity 84 formed by the upper die 81 and the lower die 82. The raw material of the sealing member 60 is then injected from a flow path 83 of the lower die 82 so as to fill the inside of the cavity 84. By doing so, the metal base substrate 22 and the plurality of control terminals 30, the plurality of main terminals 40, and the hanger terminals 42, 43, and 44 of the lead frame are sealed by the sealing member 60. At this time, the metal base substrate 22 is sealed in a state where the metal base substrate 22 is kept horizontal by the main terminals 41a, 41b, 41c, and 41d and the hanger terminals 42, 43, and 44. After molding, the upper die 81 and the lower die 82 are separated and the semiconductor device 10 is taken out. Finally, unnecessary parts, such as burrs of the sealing member 60, the tie bars of the lead frame, and parts of the hanger terminals 42, 43, and 44 that extend out of the semiconductor device 10 are removed. By doing so, the semiconductor device 10 depicted in FIGS. 1A to 3 is obtained (Step S6).

The semiconductor device 10 described above includes the first and second semiconductor elements 21a and 21b, and the metal base substrate 22, which includes the insulating layer 23 and the circuit patterns 24a, 24b, 24c, and 24d formed on the insulating layer 23 and which has the first and second semiconductor elements 21a and 21b mounted on the circuit patterns 24a, 24b, 24c, and 24d in the element region 22a set on the principal surface. The semiconductor device 10 is also provided with the main terminals 41b, 41a, 41c, and 41d, respective first ends of which are joined to the circuit patterns 24a, 24b, 24c, and 24d in the element region 22a and respective second ends of which extend outside the metal base substrate 22 from one side of the metal base substrate 22. In addition, the semiconductor device 10 includes control terminals 30, which include a control wiring portion 34 disposed in the control region 30a located adjacent to the other side that is opposite the first side where the main terminals 41b, 41a, 41c, and 41d of the metal base substrate 22 are joined, and the sealing member 60 that seals the principal surface of the metal base substrate 22 and the control region 30a.

In this semiconductor device 10, the main terminals 41b, 41a, 41c, and 41d are directly joined to the circuit patterns 24a, 24b, 24c, and 24d where the first and second semiconductor elements 21a and 21b are disposed. This means that compared to a configuration where joining is achieved by bonding wires, electrical resistance is reduced. Also, since the metal base substrate 22 is used in the semiconductor device 10, it is possible for heat produced in the first semiconductor elements 21a and the second semiconductor elements 21b to be efficiently dissipated from the heat dissipating plate 25, which suppresses increases in temperature. The control region 30a where the control wiring portion 34 of the control terminals 30 is disposed is located at a higher position than the element region 22a of the metal base substrate 22. This means that it is possible to suppress the influence of noise produced in the respective regions and to stably drive the semiconductor device 10. Accordingly, the characteristics of the semiconductor device 10 are improved. In addition, the semiconductor device 10 does not use a case that is integrally molded with the control terminals 30, the main terminals 41b, 41a, 41c, and 41d, and the like. This means that a step of molding this type of case and a step of bonding the metal base substrate 22 to the case are unnecessary. Accordingly, it is possible to simplify the manufacturing process of the semiconductor device 10 and to reduce the manufacturing cost.

According to the present embodiments, it is possible to reduce the manufacturing cost and to improve the characteristics.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a substrate including an insulating layer and a plurality of circuit patterns formed on the insulating layer, the substrate having a principal surface on which an element region is set;
a plurality of semiconductor elements provided on the plurality of circuit patterns in the element region;
a plurality of main terminals that each have a first end bonded directly to one of the plurality of circuit patterns in the element region and a second end extending out of the substrate from a first side of the substrate;
a plurality of control terminals disposed in a control region that is adjacent to a second side of the substrate opposite the first side;
a sealing member that seals the principal surface and the control region, wherein
the sealing member has a first side surface that corresponds to the first side of the substrate, and a second side surface that corresponds to the second side of the substrate,
each of the plurality of main terminals extends from the first side surface of the sealing member, and
each of the plurality of control terminals extends from the second side surface of the sealing member.

2. The semiconductor device according to claim 1, further comprising: a fixing pattern formed on the insulating layer of the substrate; and a hanger terminal having a first end and a second end, the first end being fixed to the fixing pattern and being sealed by the sealing member.

3. The semiconductor device according to claim 2, wherein the fixing pattern is formed on the second side of the substrate on the principle surface thereof.

4. The semiconductor device according to claim 3, wherein
the substrate has a corner, and
the semiconductor device further includes another fixing pattern formed in the corner of the substrate on the principle surface thereof.

5. The semiconductor device according to claim 4, wherein
the substrate has a third side and a fourth side that are between the first side and the second side, the third side being closer to the fixing pattern than the fourth side, and
the hanger terminal extends out of the substrate from the third side.

6. The semiconductor device according to claim 5, wherein
the sealing member has a third side surface that corresponds to the third side of the substrate, and a fourth side surface that corresponds to the fourth side of the substrate, and
the hanger terminal is sealed by the sealing member, with the second end thereof exposed from the third side surface or the fourth side surface of the sealing member.

7. The semiconductor device according to claim 2, wherein the fixing pattern is electrically connected only to the hanger terminal.

8. The semiconductor device according to claim 1, wherein the plurality of control terminals are located at a higher position than the principal surface of the substrate in a depth direction of the semiconductor device.

9. The semiconductor device according to claim 1, wherein
at least one of the plurality of control terminals includes a control wiring portion, and
the semiconductor device further includes an electronic component disposed on the control wiring portion.

10. The semiconductor device according to claim 1, wherein the insulating layer is formed of one of: epoxy resin, epoxy resin mixed with inorganic filler, polyimide, or polytetrafluoroethylene.

11. The semiconductor device according to claim 1, wherein each of the main terminals has
a joining portion at the first end thereof, the joining portion being in parallel to the principal surface of the substrate, and is bonded to one of the plurality of circuit patterns in the element region,
a terminal portion at the second end thereof, and
a linking portion that is inclined and integrally connects the joining portion and the terminal portion.

12. The semiconductor device according to claim 1, further comprising a bonding interface between a rear surface of the first end of each of the plurality of main terminals and a front surface of a corresponding one of the plurality of circuit patterns.

13. The semiconductor device according to claim 1, wherein
each of the plurality of main terminals has a joining portion at the first end thereof, the joining portion being bonded in parallel to the principal surface of the substrate.

14. The semiconductor device according to claim 1, wherein
in a depth direction of the semiconductor device, a shortest distance between each of the plurality of control terminals and the principal surface of the substrate is larger than a shortest distance between any of the joining portions and the principal surface of the substrate.

15. The semiconductor device according to claim 1, wherein
the first end of each of the plurality of main terminals is bonded to a side surface of one of the plurality of circuit patterns corresponding to the first side of the substrate.

16. A method of manufacturing a semiconductor device, the method comprising:
preparing a substrate including an insulating layer and a plurality of circuit patterns formed on the insulating layer, setting an element region on a principal surface of the substrate;
preparing a plurality of main terminals, and a plurality of control terminals;
disposing a first end of each of the plurality of main terminals in one of the plurality of circuit patterns in the element region, so that a second end of each of the plurality of main terminals extends out of the substrate from a first side of the substrate;
disposing the plurality of control terminals in a control region that is adjacent to a second side of the substrate opposite the first side;

directly bonding the first ends of the plurality of main terminals disposed in the plurality of circuit patterns of the substrate to the plurality of circuit patterns;

sealing the principal surface and the control region with a sealing member, wherein the substrate prepared at the step of preparing a substrate further includes a fixing pattern formed together with the plurality of circuit patterns on the insulating layer, and the method further includes:
preparing a hanger terminal,
disposing one end of the hanger terminal on the fixing pattern, and
joining the one end of the hanger terminal to the fixing pattern.

17. The method of manufacturing a semiconductor device according to claim 16, wherein the fixing pattern is formed on the second side of the substrate on the principal surface thereof.

18. The method of manufacturing a semiconductor device according to claim 17,
wherein the substrate has a corner, and another fixing pattern formed in the corner of the substrate on the principal surface thereof.

19. The method of manufacturing a semiconductor device according to claim 16,
wherein the bonding includes joining to the circuit patterns by ultrasonic bonding.

20. The method of manufacturing a semiconductor device according to claim 16, wherein
said preparing a plurality of main terminals includes preparing a plurality of main terminals such that each of the main terminals has
a joining portion at the first end thereof,
a terminal portion at the second end thereof, and
a linking portion that is inclined and integrally connects the joining portion and the terminal portion;
said disposing a first end of each of the plurality of main terminals includes disposing the joining portion of said each main terminal in parallel to the principal surface of the substrate; and
said bonding the first ends of the plurality of main terminals disposed in the plurality of circuit patterns of the substrate to the circuit patterns includes bonding the joining portions of the plurality of main terminals directly to the plurality of circuit patterns.

21. A semiconductor device, comprising:
a substrate including an insulating layer and a plurality of circuit patterns formed on the insulating layer, the substrate having a principal surface on which an element region is set, the substrate having first to fourth sides to define an outer periphery thereof, the second side being opposite to the first side, the third side being perpendicular to the first and second sides, the fourth sides being perpendicular to the first and second sides and being opposite to the third side;
a plurality of semiconductor elements provided on the plurality of circuit patterns in the element region;
a plurality of main terminals that each have a first end bonded to one of the plurality of circuit patterns in the element region and a second end extending out of the substrate from the first side of the substrate;
a plurality of control terminals disposed in a control region that is adjacent to the second side of the substrate;
a sealing member that seals the principal surface and the control region;
a fixing pattern formed on the insulating layer of the substrate; and
a hanger terminal having a first end and a second end, the first end thereof being fixed to the fixing pattern and being sealed by the sealing member, wherein the sealing member has
a first side surface that corresponds to the first side of the substrate,
a second side surface that corresponds to the second side of the substrate,
a third side surface that corresponds to the third side of the substrate, and
a fourth side surface that corresponds to the fourth side of the substrate,
each of the plurality of main terminals extends from the first side surface of the sealing member,
each of the plurality of control terminals extends from the second side surface of the sealing member, and
the hanger terminal is sealed by the sealing member, with the second end thereof exposed from the third side surface or the fourth side surface of the sealing member.

* * * * *